(12) United States Patent
Tsai et al.

(10) Patent No.: US 11,035,563 B2
(45) Date of Patent: Jun. 15, 2021

(54) LIGHT SOURCE DEVICE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Hsin-Wei Tsai, Kaohsiung (TW); I-Ju Chen, Taichung (TW); Hou-Yen Tsao, New Taipei (TW); Shu-Hua Yang, Taichung (TW); Yu-Hung Su, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

(*) Notice: Subject to any disclaimer, the term of this patent is extended or adjusted under 35 U.S.C. 154(b) by 209 days.

(21) Appl. No.: 16/535,370

(22) Filed: Aug. 8, 2019

(65) Prior Publication Data

US 2020/0049337 A1 Feb. 13, 2020

Related U.S. Application Data

(60) Provisional application No. 62/715,817, filed on Aug. 8, 2018.

(30) Foreign Application Priority Data

Dec. 12, 2018 (CN) .......................... 201822090325.X

(51) Int. Cl.
*F21V 23/06* (2006.01)
*H01L 31/12* (2006.01)
(Continued)

(52) U.S. Cl.
CPC .............. *F21V 23/06* (2013.01); *F21V 25/02* (2013.01); *G01S 17/08* (2013.01); *G01S 17/89* (2013.01);
(Continued)

(58) Field of Classification Search
None
See application file for complete search history.

(56) References Cited

U.S. PATENT DOCUMENTS 9,748,454 B2* 8/2017 Lin ....................... H01L 33/642
9,765,937 B2* 9/2017 Cha ........................... F21K 9/64
(Continued)

*Primary Examiner* — David P Porta
*Assistant Examiner* — Meenakshi S Sahu
(74) *Attorney, Agent, or Firm* — Li & Cai Intellectual Property (USA) Office

(57) ABSTRACT

A light source device includes a substrate, an upper electrode layer and a lower electrode layer respectively disposed on two opposite surfaces of the substrate, a plurality of first conductive posts and second conductive posts embedded in the substrate and having the same number, a light emitter, a surrounding frame surrounding the light emitter, and a light permeable member disposed on the surrounding frame and covering the light emitter. The first conductive posts connect a first upper electrode pad of the upper electrode layer and a first lower electrode pad of the lower electrode layer. The second conductive posts connect a second upper electrode pad of the upper electrode layer and a second lower electrode pad of the lower electrode layer. The light emitter is mounted on the first upper electrode pad and is electrically connected to the second upper electrode pad.

20 Claims, 12 Drawing Sheets

(51) Int. Cl.

| | |
|---|---|
| *F21V 25/02* | (2006.01) |
| *H01S 5/042* | (2006.01) |
| *G01S 17/08* | (2006.01) |
| *G01S 17/89* | (2020.01) |
| *H01S 5/02216* | (2021.01) |
| *H01L 23/00* | (2006.01) |
| *H01L 25/075* | (2006.01) |
| *H01L 25/16* | (2006.01) |
| *H01L 33/48* | (2010.01) |
| *H01L 33/54* | (2010.01) |
| *F21Y 115/30* | (2016.01) |
| *H01L 33/62* | (2010.01) |
| *F21Y 115/10* | (2016.01) |

(52) U.S. Cl.
CPC .............. *H01L 24/48* (2013.01); *H01L 24/49* (2013.01); *H01L 25/0753* (2013.01); *H01L 25/167* (2013.01); *H01L 31/12* (2013.01); *H01L 33/486* (2013.01); *H01L 33/54* (2013.01); *H01S 5/02216* (2013.01); *H01S 5/0425* (2013.01); *F21Y 2115/10* (2016.08); *F21Y 2115/30* (2016.08); *H01L 33/62* (2013.01); *H01L 2224/48091* (2013.01); *H01L 2224/48137* (2013.01); *H01L 2224/48247* (2013.01); *H01L 2224/49109* (2013.01)

(56) References Cited

U.S. PATENT DOCUMENTS

| | | | |
|---|---|---|---|
| 10,260,734 B2* | 4/2019 | Kim | .................. F21V 29/70 |
| 10,866,375 B2* | 12/2020 | Tsai | .................. H01S 5/02345 |
| 2016/0076729 A1* | 3/2016 | Jin | .................. F21S 41/33 |
| | | | 362/509 |
| 2020/0051965 A1* | 2/2020 | Tsai | .................. H01L 24/48 |

* cited by examiner

LIGHT SOURCE DEVICE

CROSS-REFERENCE TO RELATED PATENT APPLICATION

This application claims the benefit of priority to China Patent Application No. 201822090325.X, filed on Dec. 12, 2018 in People's Republic of China. The entire content of the above identified application is incorporated herein by reference.

This application claims priority from U.S. Provisional Patent Application Ser. No. 62/715,817 filed on Aug. 8, 2018, which application is incorporated herein by reference in its entirely.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source device, and more particularly to a light source device adapted for transmitting a high frequency (or high speed) signal.

BACKGROUND OF THE DISCLOSURE

A conventional light source device mostly uses a TO-CAN package, and has not undergone significant structural improvements in recent years, so that it has become difficult for the conventional light source device to meet various requirements, such as an infrared light source to be used for three-dimensional sensing. Moreover, the conventional light source device is also difficult to be applied to transmit a high frequency (or high speed) signal.

SUMMARY OF THE DISCLOSURE

In response to the above-referenced technical inadequacies, the present disclosure provides a light source device to effectively improve the issues associated with conventional light source devices.

In one aspect, the present disclosure provides a light source device, which includes a substrate, an upper electrode layer, a lower electrode layer, a plurality of first conductive posts, a plurality of second conductive posts, a light emitter, a surrounding frame, and a light permeable member. The substrate includes a first surface and a second surface opposite to the first surface. The upper electrode layer is disposed on the first surface of the substrate and includes a first upper electrode pad and at least one second upper electrode pad. The first upper electrode pad includes a die-bonding portion and a periphery portion arranged outside of the die-bonding portion. The lower electrode layer is disposed on the second surface of the substrate and includes a first lower electrode pad and at least one second lower electrode pad. The light emitter is mounted on the die-bonding portion of the first upper electrode pad and is electrically connected to the at least one second upper electrode pad. The surrounding frame is disposed on the first surface and is surroundingly disposed at an outer side of the light emitter. The light permeable member is disposed on the surrounding frame and covers the light emitter. The first conductive posts are embedded in the substrate to connect the first upper electrode pad and the first lower electrode pad, and the first conductive posts are arranged along at least two sides of the light emitter at the periphery portion. The second conductive posts are embedded in the substrate to connect the at least one second upper electrode pad and the at least one second lower electrode pad.

In one aspect, the present disclosure provides a light source device, which includes a substrate, an upper electrode layer, a lower electrode layer, a plurality of first conductive posts, a plurality of second conductive posts, a light emitter, a surrounding frame, and a light permeable member. The substrate includes a first surface and a second surface opposite to the first surface. The upper electrode layer is disposed on the first surface of the substrate and includes a first upper electrode pad and at least one second upper electrode pad. The first upper electrode pad includes a die-bonding portion and a periphery portion arranged outside of the die-bonding portion. The lower electrode layer is disposed on the second surface of the substrate and includes a first lower electrode pad and at least one second lower electrode pad. The light emitter is mounted on the die-bonding portion of the first upper electrode pad and is electrically connected to the at least one second upper electrode pad. The surrounding frame is disposed on the first surface and is surroundingly disposed at an outer side of the light emitter. The light permeable member is disposed on the surrounding frame and covers the light emitter. The first conductive posts are embedded in the substrate to connect the first upper electrode pad and the first lower electrode pad, and the first conductive posts are arranged along at least three sides of the light emitter at the periphery portion. The second conductive posts are embedded in the substrate to connect the at least one second upper electrode pad and the at least one second lower electrode pad.

Therefore, the light source device of the present disclosure has a new structural configuration by the arrangement of the components (e.g., the arrangement of the first conductive posts, the second conductive posts, the upper electrode layer, and the lower electrode layer), so that the light source device can be applied to transmit a high frequency (or high speed) signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
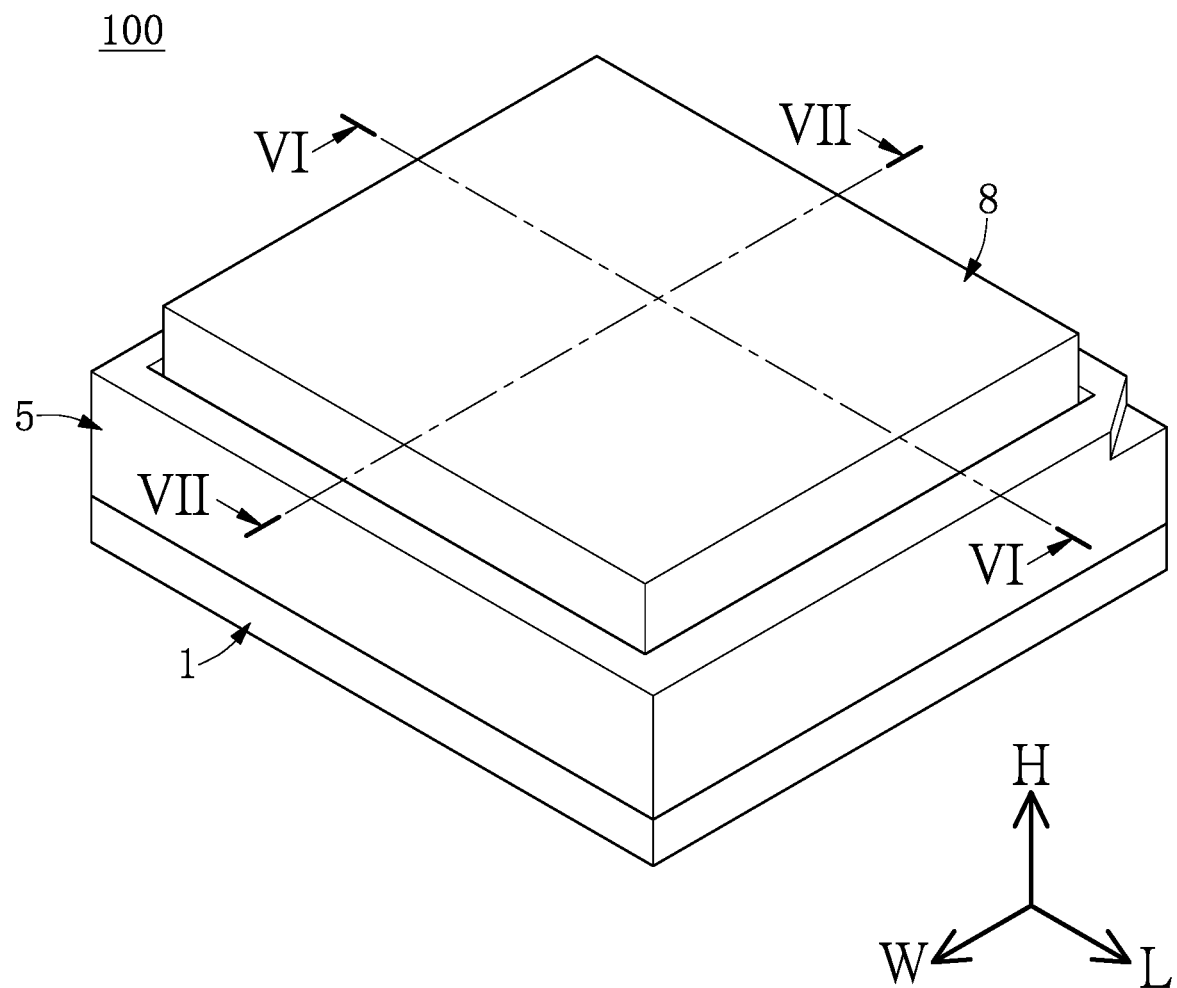
FIG. 1 is a perspective view of a light source device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 12, embodiments of the present disclosure each provide a light source device 100. The light source device 100 of the present embodiment is particularly applied for three-dimensional sensing, and more particularly to time-of-flight depth camera, but the present disclosure is not limited thereto. In other words, the present disclosure also provides a depth camera module, which includes the light source device 100 of any one of the embodiments. As shown in FIG. 1 to FIG. 7, the light source device 100 includes a substrate 1, an upper electrode layer 2 and a lower electrode layer 3 both disposed on two opposite sides of the substrate 1, a conductive unit 4 embedded in the substrate 1, a surrounding frame 5 disposed on the substrate 1, a light emitter 6 and a light detector 7 both spaced apart from each other and mounted on the upper electrode layer 2, a light permeable member 8 disposed on the surrounding frame 5, and an adhesive 9 fixing the light permeable member 8 onto the surrounding frame 5. The following description describes the structure and connection of each component of the light source device 100.

Figure 5:
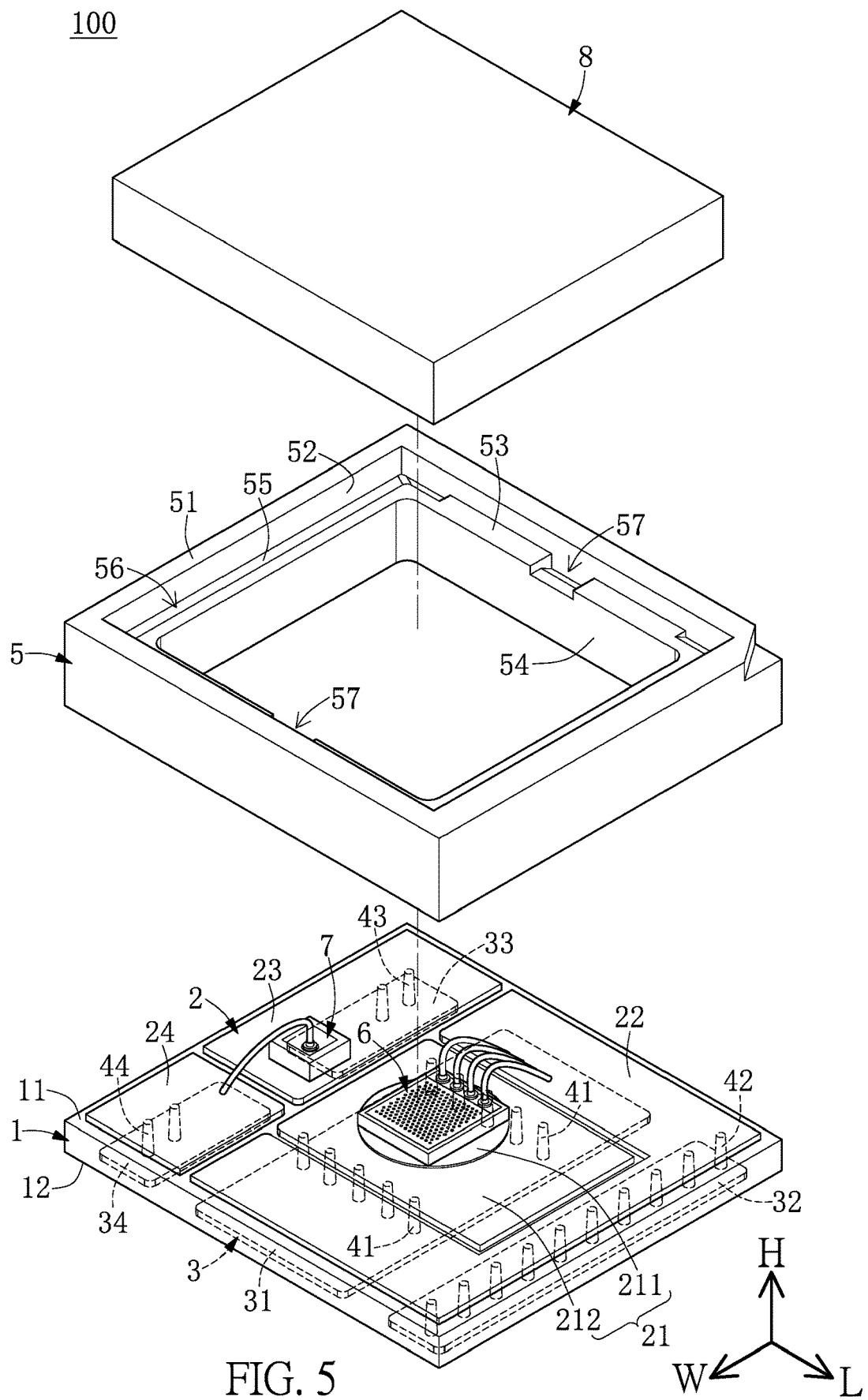
FIG. 5 is an exploded view of FIG. 3 with the adhesive omitted.
Figure 6:
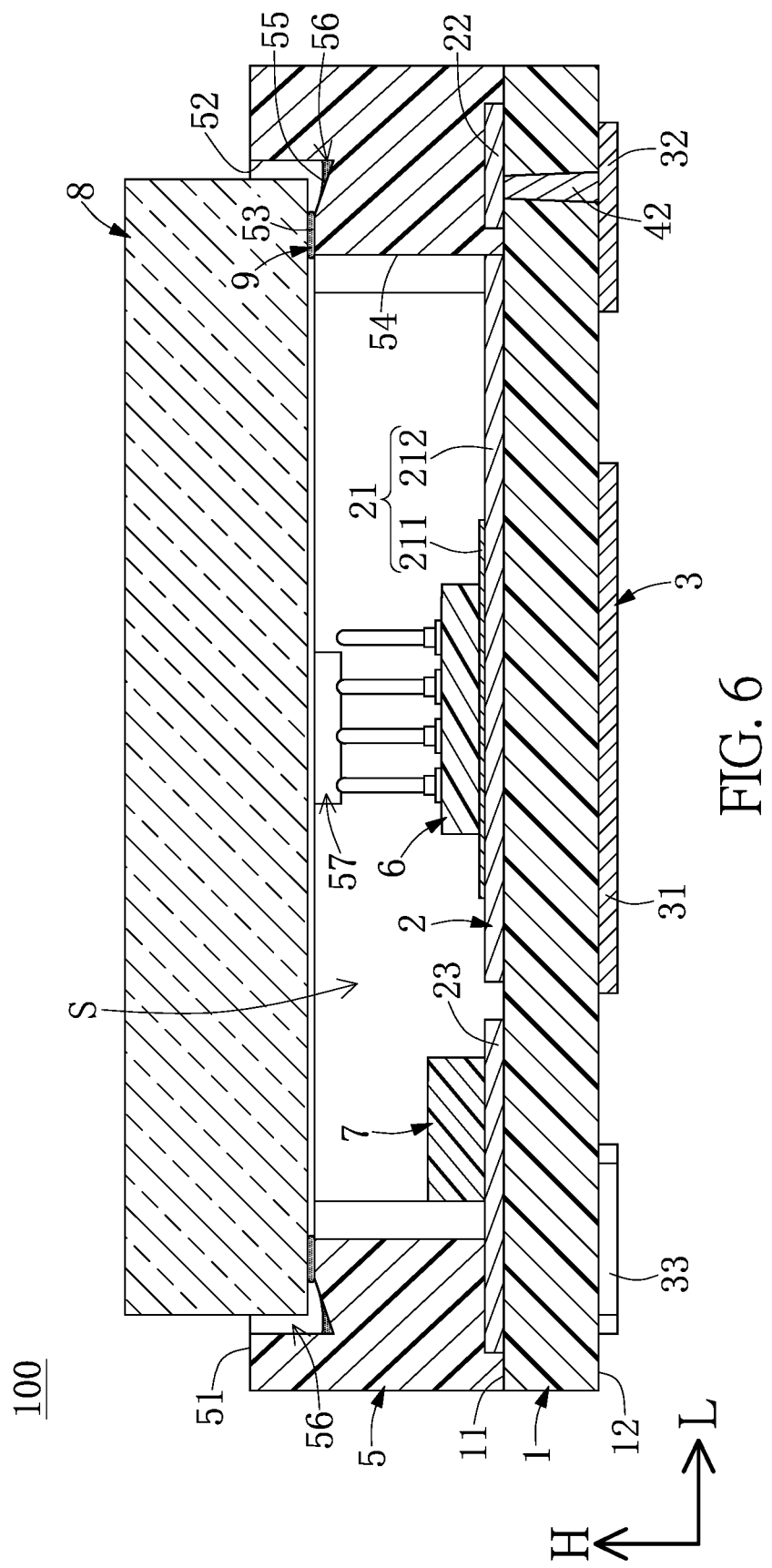
FIG. 6 is a cross-sectional view taken along a cross-section line VI-VI of FIG. 1.
Figure 7:
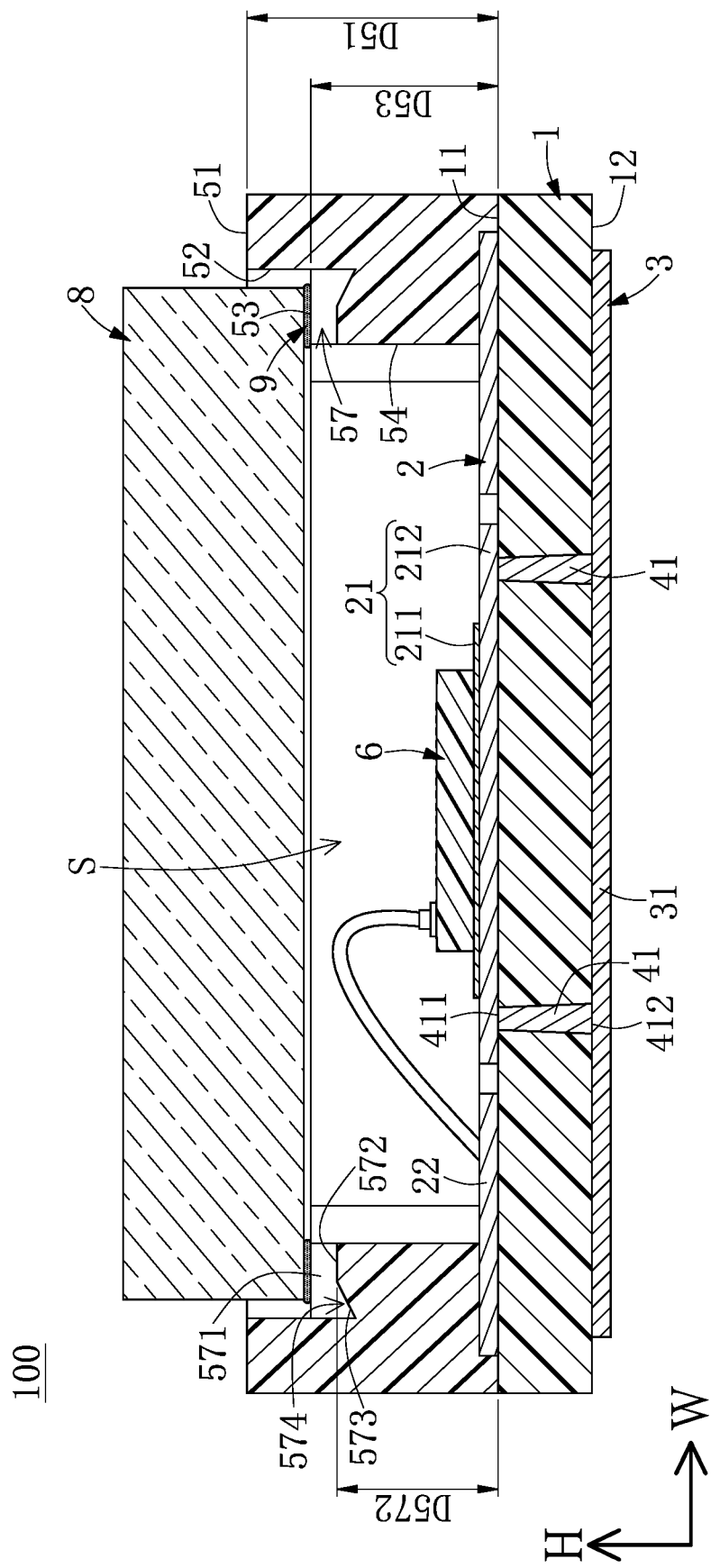
FIG. 7 is a cross-sectional view taken along a cross-section line VII-VII of FIG. 1.

As shown in FIG. 5 to FIG. 7, the substrate 1 in the present embodiment is substantially in a rectangular shape or a square shape and defines a longitudinal direction L, a width direction W, and a height direction H, which are orthogonal to each other, for the purpose of demonstrating the relative positioning of the components of the light source device 100. The substrate 1 of the present embodiment is an insulating substrate, such as a printed circuit board or a ceramic board, and includes a first surface 11 and a second surface 12 opposite to the first surface 11.

Figure 4:
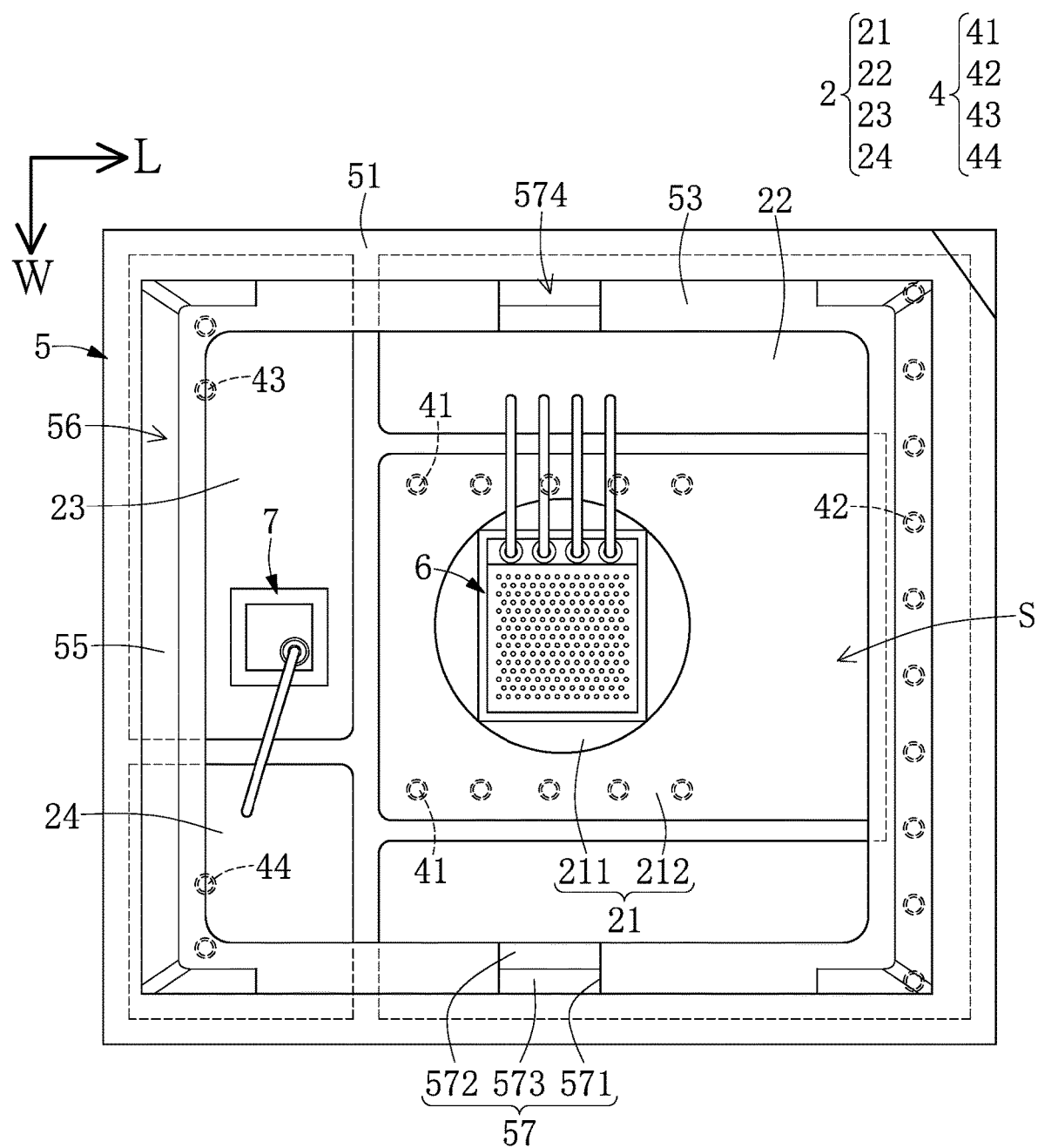
FIG. 4 is a top view of FIG. 1 with the adhesive and a light permeable member both omitted.

The upper electrode layer 2 is disposed on the first surface 11 of the substrate 1, and includes a plurality of upper electrode pads 21-24 spaced apart from each other. The upper electrode pads 21-24 preferably correspond in geometrical shape to each other, thereby covering at least 80% of an area of the first surface 11. However, the shape of each of the upper electrode pads 21-24 may be adjusted or changed according to design requirements, and is not limited to that shown in the drawings. As shown in FIG. 4, the upper electrode layer 2 includes four upper electrode pads 21-24, two of the four upper electrode pads 21 are provided for die-bonding and wire-bonding of the light emitter 6 and are respectively named as a first upper electrode pad 21 and a second upper electrode pad 22, and the other two of the four upper electrode pads 21-24 are provided for die-bonding and wire-bonding of the light detector 7 and are respectively named as a third upper electrode pad 23 and a fourth upper electrode pad 24. The number of the second upper electrode pad 22 of the present disclosure may be at least one.

Specifically, the upper electrode layer 2 in the present embodiment includes the first upper electrode pad 21, the second upper electrode pad 22, the third upper electrode pad 23, and the fourth upper electrode pad 24. The second upper electrode pad 22 in the present embodiment has a U-shaped notch formed on an inner edge thereof. The first upper electrode pad 21 is in a rectangular shape, and is arranged inside of the U-shaped notch of the second upper electrode pad 22. The first upper electrode pad 21 and the second upper electrode pad 22 cover at least 60% of the area of the first surface 11. Each of the third upper electrode pad 23 and the fourth upper electrode pad 24 is in a rectangular shape. The third upper electrode pad 23 and the fourth upper electrode pad 24 are arranged in one row along the width direction W and at one side of the first upper electrode pad 21 and the second upper electrode pad 22.

Moreover, the first upper electrode pad 21 includes a die-bonding portion 211 and a periphery portion 212 arranged outside of the die-bonding portion 211. The die-bonding portion 211 is substantially disposed on a central portion of the first surface 11 and is arranged adjacent to the third upper electrode pad 23, thereby allowing the light emitter 6 to be mounted.

The lower electrode layer 3 is disposed on the second surface 12 of the substrate 1, and includes a plurality of lower electrode pads 31-34 spaced apart from each other. The lower electrode pads 31-34 correspond to the upper electrode pads 21-24 along the height direction H, respectively. Moreover, the conductive unit 4 embedded in the substrate 1 includes a plurality of conductive posts 41-44, and two ends of each of the conductive posts 41-44 are respectively connected to the upper electrode layer 2 and the lower electrode layer 3, so that the upper electrode layer 2 and the lower electrode layer 3 can be electrically connected to each other through the above-mentioned conductive unit 4.

Figure 2:
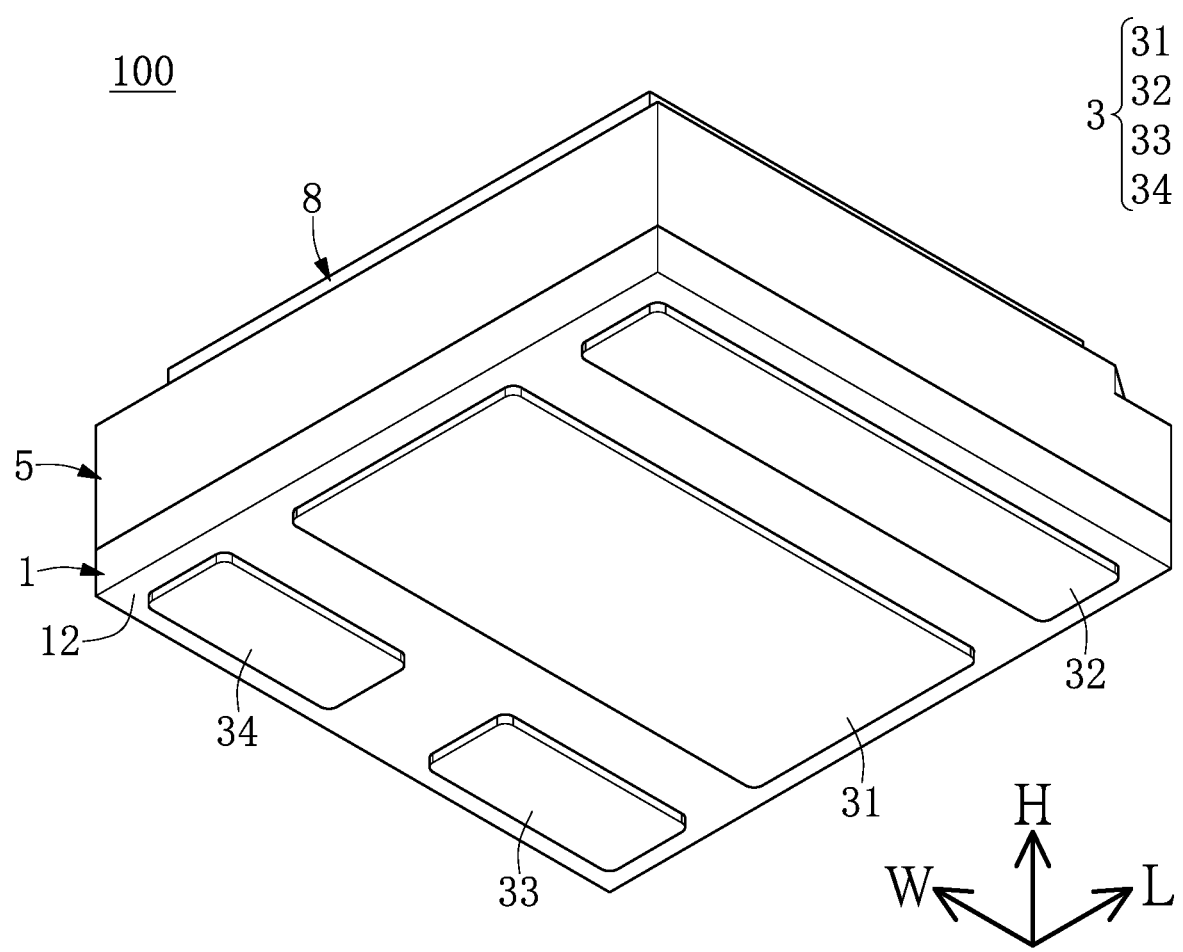
FIG. 2 is a perspective view showing the light source device of FIG. 1 from another view angle.

Specifically, as shown in FIG. 2, the lower electrode layer 3 in the present embodiment includes a first lower electrode pad 31, a second lower electrode pad 32, a third lower electrode pad 33, and a fourth lower electrode pad 34. Each of the lower electrode pads 31-34 is in a rectangular shape, and has a longitudinal direction parallel to the width direction W of the substrate 1. The second lower electrode pad 32 is arranged at a side of the first lower electrode pad 31, and the third lower electrode pad 33 and the fourth lower electrode pad 34 are arranged at an opposite side of the first lower electrode pad 31.

As shown in FIG. 4 and FIG. 5, the conductive unit 4 in the present embodiment includes a plurality of first conductive posts 41, a plurality of second conductive posts 42, a plurality of third conductive posts 43, and a plurality of fourth conductive posts 44. The first conductive posts 41 are arranged along at least two sides of the light emitter 6 at the periphery portion 212, and connect the first upper electrode pad 21 and the first lower electrode pad 31. The second conductive posts 42 are arranged in one row and connect the second upper electrode pad 22 and the second lower electrode pad 32. The third conductive posts 43 are connected to the third upper electrode pad 23 and the third lower electrode pad 33. The fourth conductive posts 44 are connected to the fourth upper electrode pad 24 and the fourth lower electrode pad 34.

In the present embodiment, the number of the first conductive posts 41 is substantially equal to the number of the second conductive posts 42. For example, the number of the first conductive posts 41 can be less than or larger than the number of the second conductive posts 42 by one or two. The number of the first conductive posts is at least eight (e.g., eight to twelve), the number of the third conductive posts 43 is at least two, and the number of the fourth conductive posts 44 is at least two. Each of the first conductive posts 41 (or each of the conductive posts 41-44) is in a truncated cone, and includes a top surface 411 adjacent to the first surface 11 and a bottom surface 412 adjacent to the second surface 12. In each of the first conductive posts 41 (or each of the conductive posts 41-44), an area of the top surface 411 is less than an area of the bottom surface 412, and a ratio defined by dividing a diameter of the top surface 411 by a diameter of the bottom surface 412 is preferably within a range of 2/3 to 4/5, but the present disclosure is not limited thereto. For example, in other embodiments of the present disclosure, the area of the top surface of each of the conductive posts 41-44 can be larger than that of the bottom surface.

In addition, as shown in FIG. 4 and FIG. 5, the first conductive posts 41 are arranged in two rows. Each of the two rows is parallel to the longitudinal direction L, and includes at least four of the first conductive posts 41. The two rows of the first conductive posts 41 are arranged at the periphery portion 212, and are respectively arranged along two opposite sides of the light emitter 6. The second conductive posts 42 are arranged in one row parallel to the width direction W, and the row of the second conductive posts 42 are connected to the second upper electrode pad 22 and the second lower electrode pad 32.

As shown in FIG. 5 to FIG. 7, the surrounding frame 5 is disposed on the first surface 11 of the substrate 1, and outer lateral sides of the surrounding frame 5 are preferably flush with outer lateral sides of the substrate 1. An outermost periphery portion of the upper electrode layer 2 (e.g., a portion of each of the upper electrode pads 21) is embedded in the surrounding frame 5. The surrounding frame 5 has an annular step-like structure and is integrally formed as a one-piece structure in the present embodiment, but the present disclosure is not limited thereto. For example, in other embodiments of the present disclosure, the surrounding frame 5 and the substrate 1 can be integrally formed as a one-piece structure.

Specifically, the surrounding frame 5 sequentially includes an upper tread 51, an upper riser 52 connected to an inner edge of the upper tread 51, a lower tread 53, and a lower riser 54 connected to an inner edge of the lower tread 53. The upper tread 51, the upper riser 52, the lower tread 53, and the lower riser 54 are arranged from an outer side to an inner side of the surrounding frame 5. Moreover, the surrounding frame 5 in the present embodiment includes two slanting surfaces 55 each connected to the upper riser 52 and the lower tread 53, and the two slanting surfaces 55 are respectively connected to two opposite edges of the lower tread 53 (e.g., two short edges of the lower tread 53 shown in FIG. 4). The surrounding frame 5 is made of polymer material or ceramic material.

The upper tread 51 is in a rectangular and annular shape or a square and annular shape, and is arranged away from the substrate 1. The upper tread 51 in the present embodiment is a top surface of the surrounding frame 5, and is preferably parallel to the first surface 11 of the substrate 1. The upper riser 52 is in a rectangular and annular shape or a square and annular shape, and is perpendicularly connected to the inner edge of the upper tread 51. The lower tread 53 is in a rectangular and annular shape or a square and annular shape, and is arranged at an inner side of the upper riser 52. The lower tread 53 is preferably parallel to the upper tread 51, and a distance D53 between the lower tread 53 and the first surface 11 is less than a distance D51 between the upper tread 51 and the first surface 11. The lower riser 54 is in a rectangular and annular shape or a square and annular shape. The lower riser 54 is perpendicularly connected to the inner edge of the lower tread 53, and is arranged away from the upper tread 51. The lower riser 54 and the first surface 11 of the substrate 1 jointly and surroundingly form an accommodating space S.

Moreover, an edge of each of the two slanting surfaces 55 (e.g., an inner edge of each of the two slating surfaces 55 shown in FIG. 6) is connected to the lower tread 53 so as to jointly form an angle more than 90 degrees, and another edge of each of the two slanting surfaces 55 (e.g., an outer edge of each of the two slating surfaces 55 shown in FIG. 6) is connected to the upper riser 52 so as to jointly form a receiving groove 56 having an angle less than 90 degrees. In other words, the positions of the two receiving grooves 56 are opposite to each other along the longitudinal direction L, but the present disclosure is not limited thereto. For example, in other embodiments of the present disclosure, the surrounding frame 5 can be formed with at least one slanting surface 55 and at least one receiving groove 56 corresponding in position to the at least one slanting surface 55, or the surrounding frame 5 can be formed without any slanting surface 55 and any receiving groove 56.

As shown in FIG. 5 to FIG. 7, the surrounding frame 5 has two notches 57 each recessed in the lower tread 53 and the lower riser 54 and being in spatial communication with the accommodating space S. The positions of the two notches 57 are opposite to each other along the width direction W. In the present embodiment, the two notches 57 are located at centers of two long edges of the lower tread 53, respectively. That is to say, the two receiving grooves 56 and the two notches 57 of the surrounding frame 5 respectively correspond in position to four edges of the lower tread 53, but the present disclosure is not limited thereto. For example, in other embodiments of the present disclosure, the surrounding frame 5 can be formed with at least one notch 57.

Figure 3:
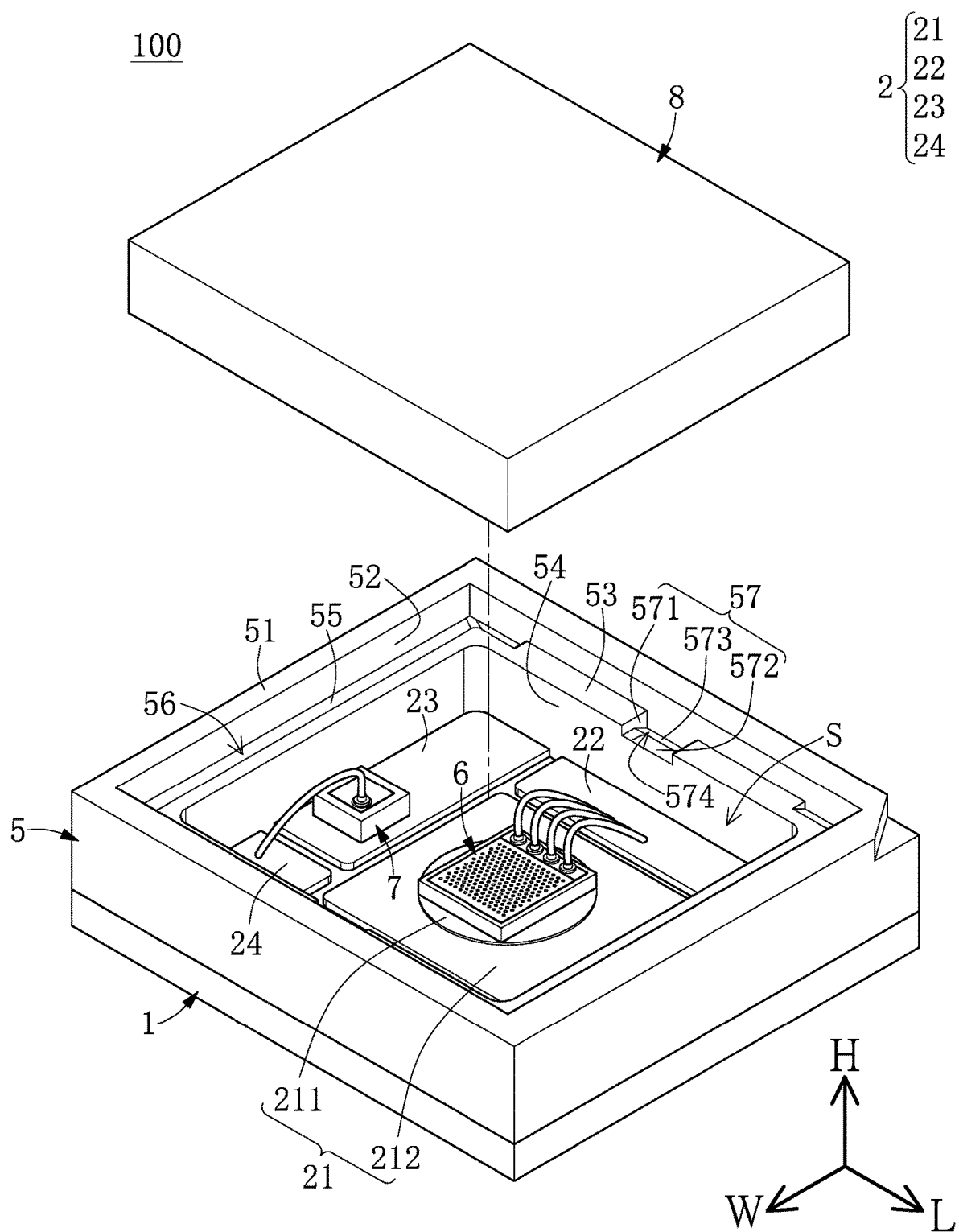
FIG. 3 is an exploded view of FIG. 1 with an adhesive omitted.

Specifically, as shown in FIG. 3, FIG. 4 and FIG. 7, each of the two notches 57 includes two inner walls 571 facing and spaced apart from each other, a flat bottom wall 572, and a slanting bottom wall 573. The flat bottom wall 572 and the slanting bottom wall 573 are arranged between the two inner walls 571. In each of the two notches 57, each of the two inner walls 571 is perpendicularly connected to the upper tread 52, and a distance D572 between the flat bottom wall 572 and the first surface 11 is less than the distance D53 between the lower tread 53 and the first surface 11. Moreover, in each of the two notches 57, an edge of the slanting bottom wall 573 (e.g., an inner edge of the slanting bottom wall 573 shown in FIG. 7) is connected to the flat bottom wall 572 so as to jointly form an angle more than 90 degrees, and another edge of the slanting bottom wall 573 (e.g., an outer edge of the slanting bottom wall 573 shown in FIG. 7) is connected to the upper riser 52 so as to jointly form a slot 574 having an angle less than 90 degrees. The slot 574 is in a V-shape for receiving dust or particles, thereby preventing dust or particles from entering the accommodating space S.

As shown in FIG. 5 to FIG. 7, the light emitter 6 in the present embodiment is a Vertical-Cavity Surface-Emitting Laser (VCSEL) for providing an infrared light, and the light detector 7 in the present embodiment is a photodiode (PD), but the present disclosure is not limited thereto. The light detector 7 is configured to receive an invisible light (i.e., a light signal) emitted from the light emitter 6 and reflected by the light permeable member 8 so as to monitor the light signal and prevent the unexpected light beam (e.g., a laser light) of the light emitter 6 from harming eyes, thereby providing an eye safety function. For example, in other embodiments of the present disclosure, the light emitter 6 can be at least one infrared LED chip.

The light emitter 6 and the light detector 7 are arranged in the accommodating space S or are arranged inside of the surrounding frame 5. The light emitter 6 is preferably disposed on a center portion of the first surface 11, and the light emitter 6 and the light detector 7 are preferably arranged along the longitudinal direction L. Specifically, the light emitter 6 in the present embodiment is mounted on the die-bonding portion 211 of the first upper electrode pad 21, and is electrically connected to the second upper electrode pad 22 by a wire-bonding manner. The light detector 7 in the present embodiment is mounted on the third upper electrode pad 23, and is electrically connected to the fourth upper electrode pad 24 by a wire-bonding manner. It should be noted that the first conductive posts 41 are preferably arranged outside of a projected space defined by orthogonally protecting the light emitter 6 toward the second surface 12, but the present disclosure is not limited thereto.

As shown in FIG. 5 to FIG. 7, the light permeable member 8 in the present embodiment includes a transparent glass board and a light-diffusion polymer layer formed on the transparent glass board. The light permeable member 8 is disposed on the lower tread 53 of the surrounding frame 5 and is spaced apart from the upper riser 52 (i.e., the light permeable member 8 does not contact the upper riser 52), so that each of the two notches 57 is formed as an air channel in spatial communication with the accommodating space S and an external space. Moreover, a protruding part of the light permeable member 8 protrudes from the upper tread 51 of the surrounding frame 5, and a volume of the protruding part of the light permeable member 8 is more than 50% of a total volume of the light permeable member 8, but the present disclosure is not limited thereto. For example, as shown in FIG. 10, the light permeable member 8 does not protrude from the upper tread 51 of the surrounding frame 5.

Moreover, the light permeable member 8 is fixed onto the lower tread 53 of the surrounding frame 5 through the adhesive 9, and the connection between the light permeable member 8 and the lower tread 53 can be gapless by the adhesive 9. Each of the two receiving grooves 56 of the surrounding frame 5 is configured to receive a part of the adhesive 9 (e.g., a part of the adhesive 9 overflowing from the light permeable member 8 and the lower tread 53).

Figure 8:
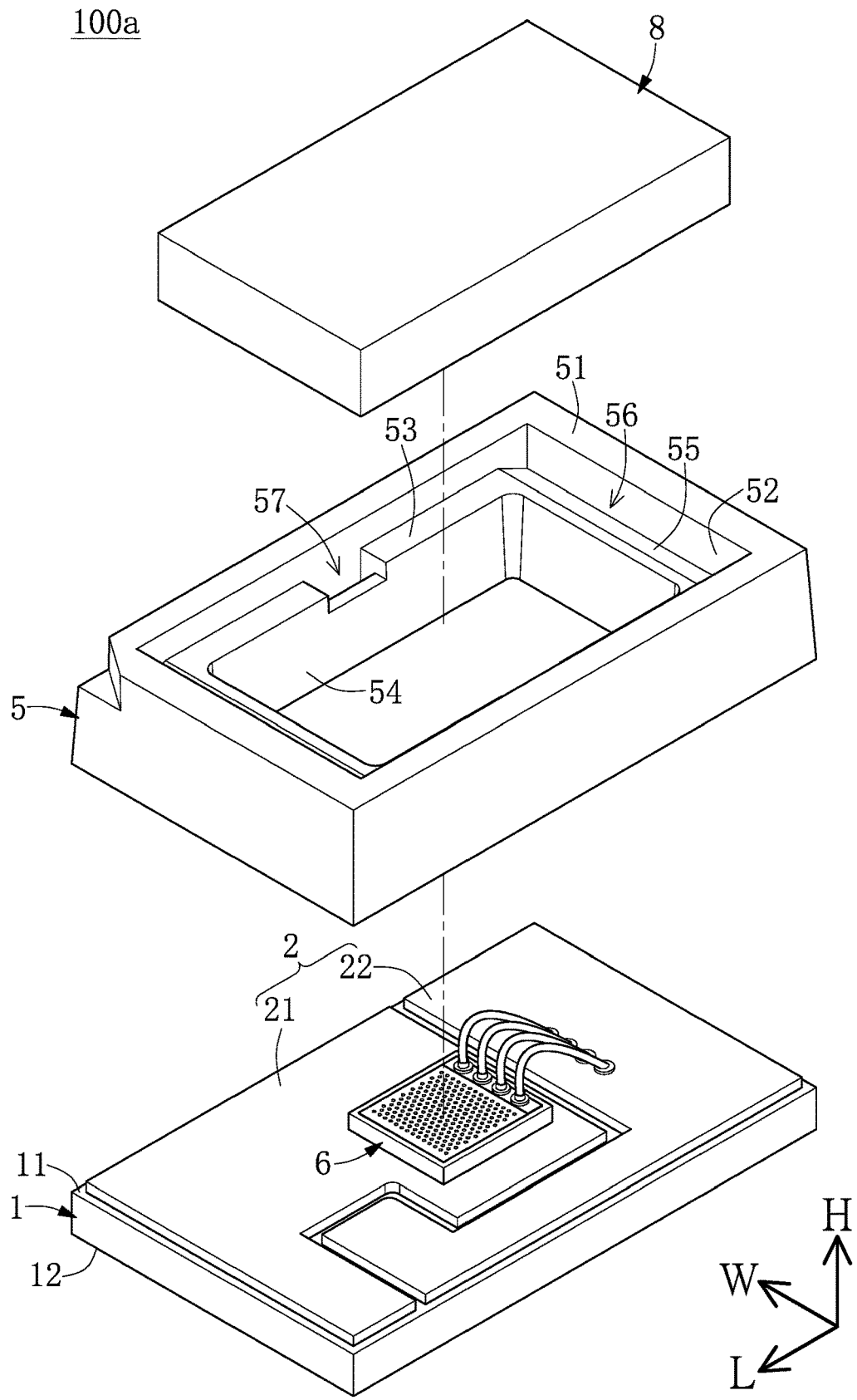
FIG. 8 is an exploded view of a light source device with an adhesive omitted according to a second embodiment of the present disclosure.
Figure 9:
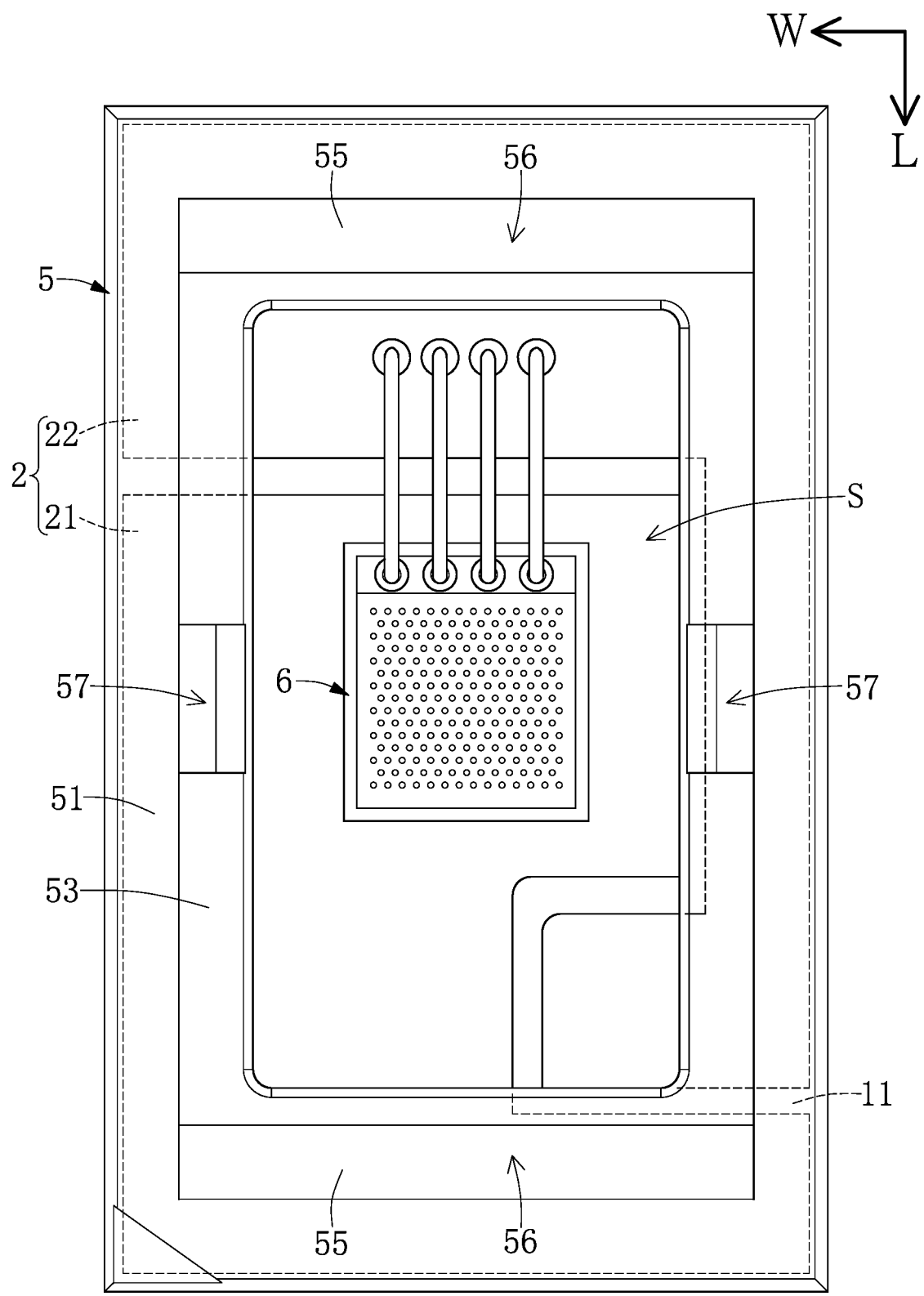
FIG. 9 is a top view of FIG. 8 with the adhesive and a light permeable member both omitted.

In addition, the light source device 100 of the present embodiment is described with the above components, but the structure of the light source device 100 can be adjusted or changed according to design requirements. For example, the inside structure of the light source device 100 can be adjusted according to other embodiments shown in FIG. 8 to FIG. 12. As shown in FIG. 8 and FIG. 9, the light source device 100a can be formed without the light detector 7, and the upper electrode layer 2 excludes the third upper electrode pad 23 and the fourth upper electrode pad 24. As shown in FIG. 10 to FIG. 12, the surrounding frame 5 of the light source device 100 can include only one notch 57, the receiving groove 56 can be in a C-shape (i.e., the connection area of the slanting surface 55 and the upper tread 52 is in a C-shape), the notch 57 is arranged between two free ends of the C-shaped receiving groove 56, and a part of the adhesive 9 in the C-shaped receiving groove 56 can be used to connect the light permeable member 8.

Figure 10:
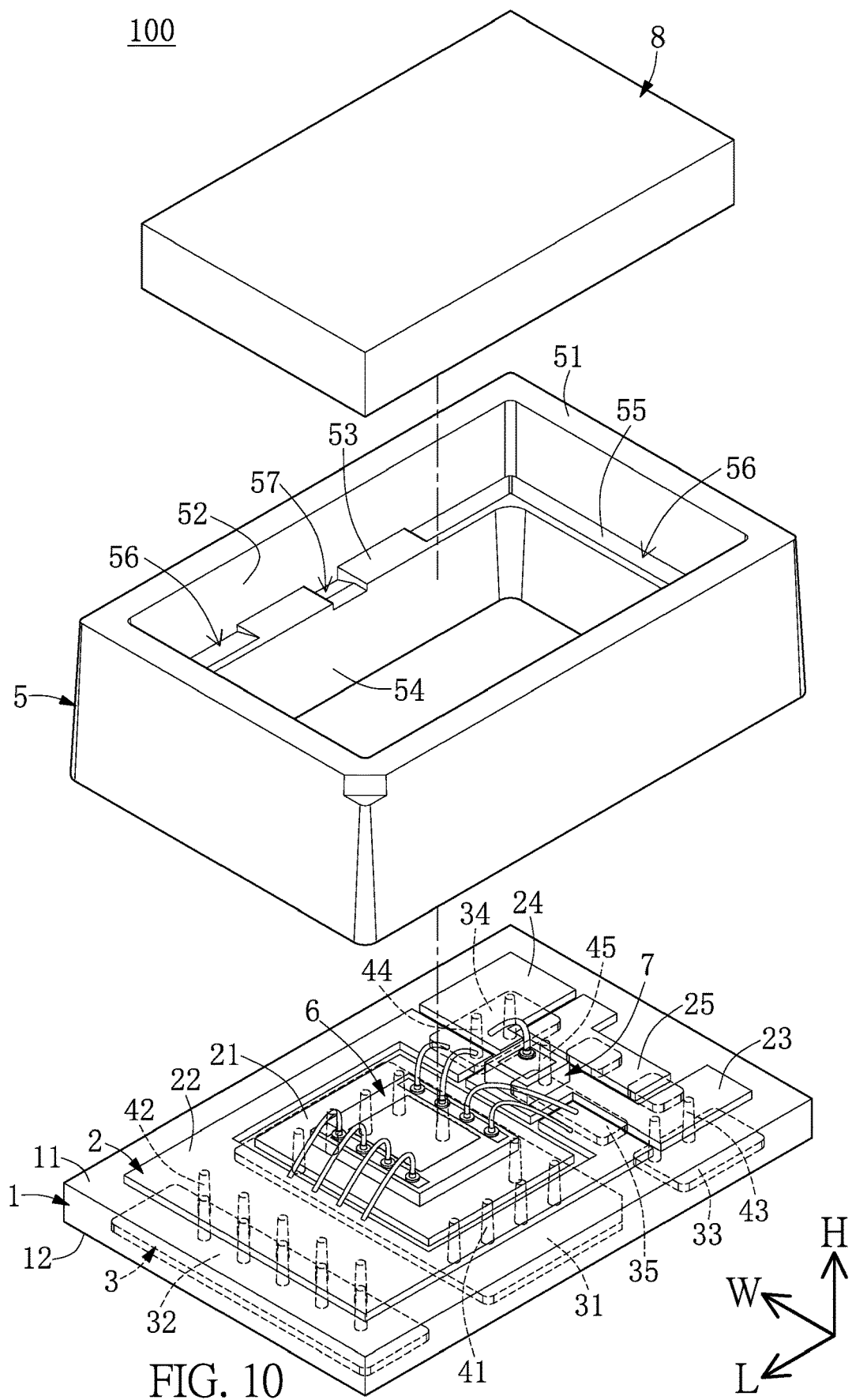
FIG. 10 is an exploded view of a light source device with an adhesive omitted according to a third embodiment of the present disclosure.
Figure 11:
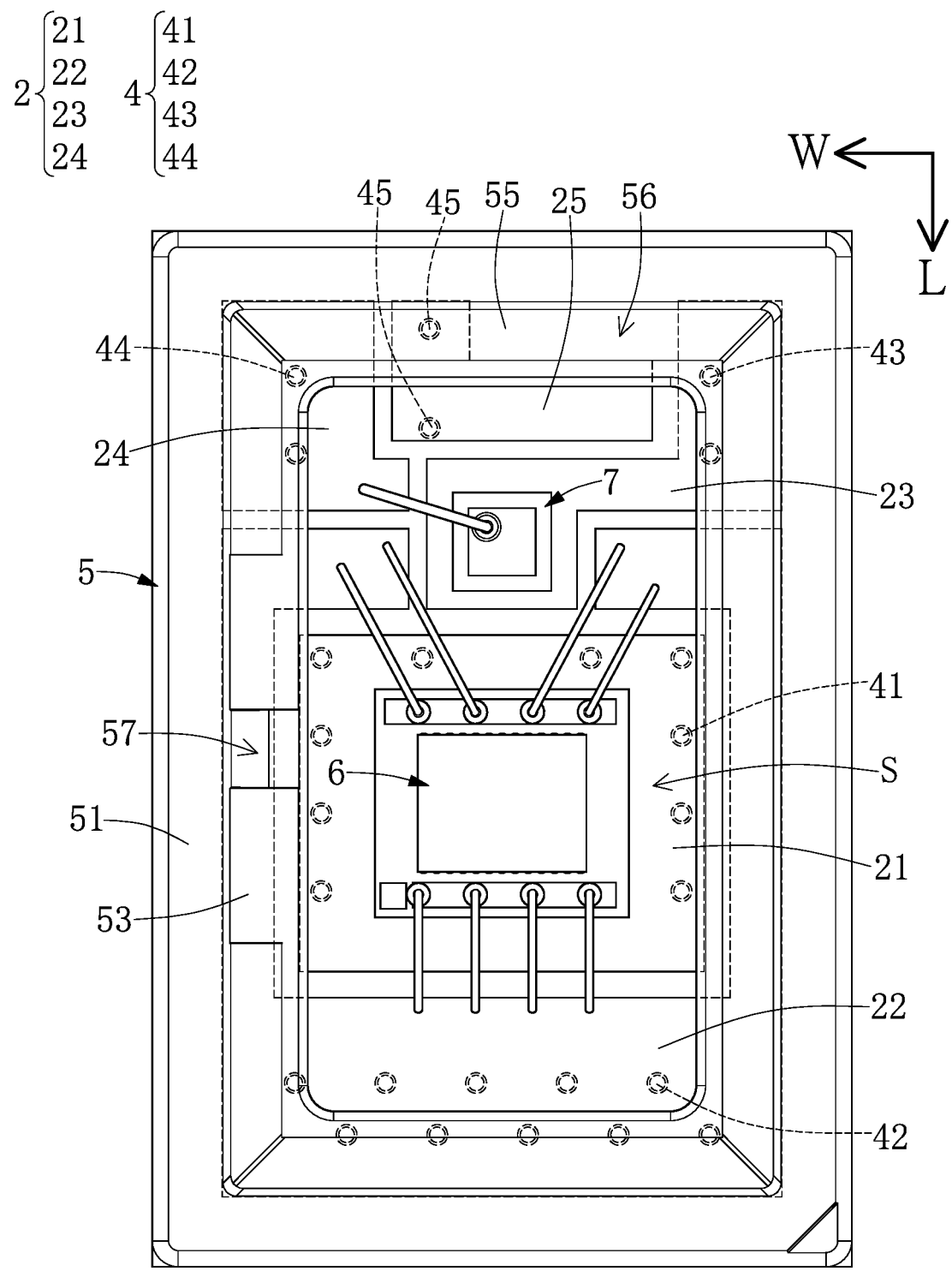
FIG. 11 is a top view of FIG. 10 with the adhesive and a light permeable member both omitted.
Figure 12:
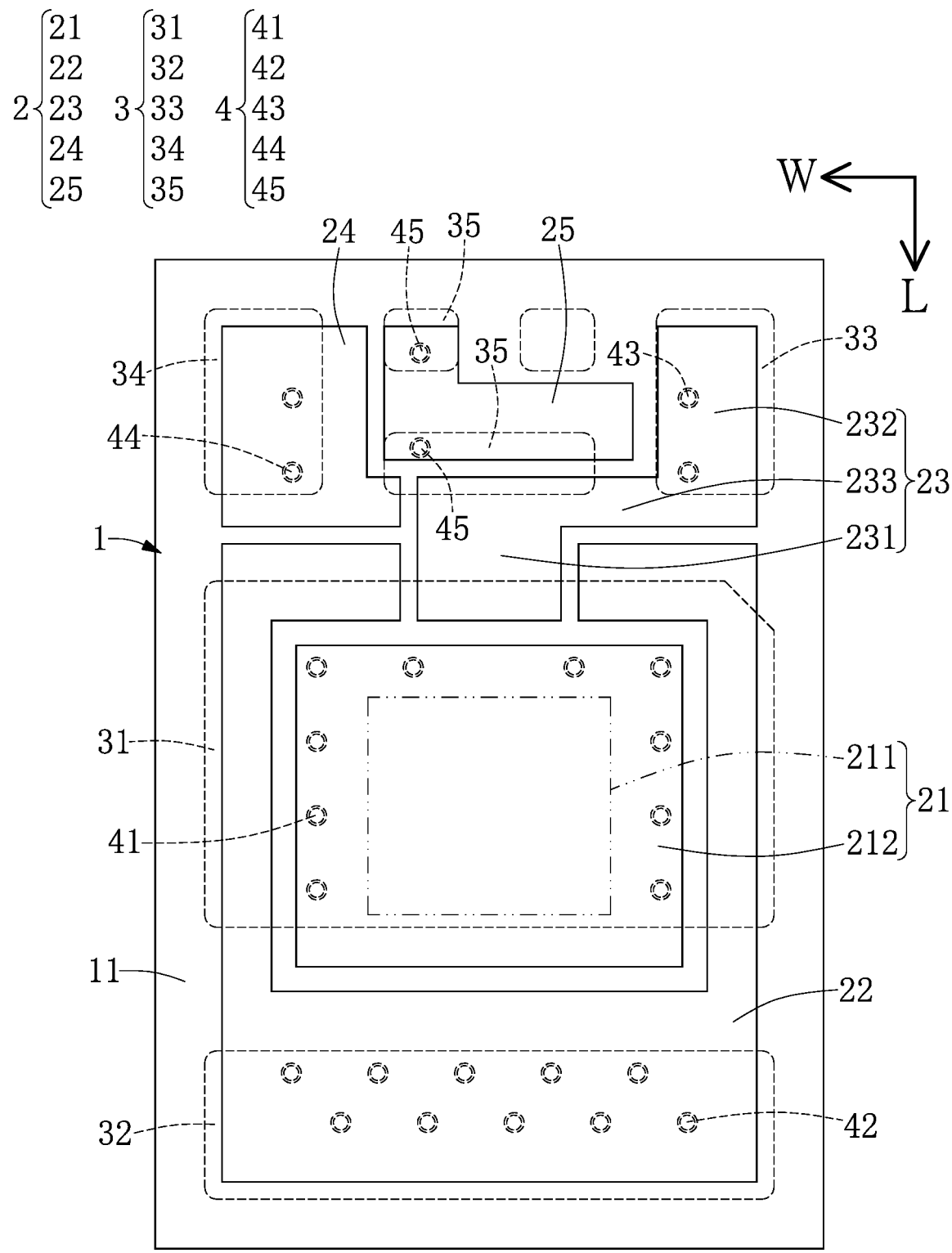
FIG. 12 is a planar view showing a substrate, an upper electrode layer, and a conductive unit of FIG. 10.

Specifically, as shown in FIG. 10 to FIG. 12, the second upper electrode pad 22 is substantially in a C-shape for surrounding the first upper electrode pad 21. The first upper electrode pad 21 is in a rectangular shape and is arranged in a region surroundingly defined by the second upper electrode pad 22. The first upper electrode pad 21 the second upper electrode pad 22 cover at least 60% of the area of the first surface 11. The third upper electrode pad 23 includes a first flat portion 231, a second flat portion 232, and a connecting bar 233 that connects the first flat portion 231 and the second flat portion 232. The first flat portion 231 is substantially in a rectangular shape or a square shape. A part of the first flat portion 231 is arranged between two free ends of the second upper electrode pad 22 (i.e., is arranged in an opening between the two ends of the second upper electrode pad 22), and the other part of the first flat portion 231 is arranged outside of the second upper electrode pad 22. Specifically, the second flat portion 232 and the fourth upper electrode pad 24 are respectively arranged at two opposite sides of the first flat portion 231. The connecting bar 233 connects the part of the first flat portion 231 arranged outside of the second upper electrode pad 22 and an adjacent part of the second flat portion 232.

Moreover, the die-bonding portion 211 of the first upper electrode pad 21 is substantially disposed on a central portion of the first surface 11, and is arranged adjacent to the third upper electrode pad 23. The first conductive posts 41 are in a U-shaped arrangement that defines an opening, and connect the upper electrode pad 21 and the lower electrode pad 31 at the periphery portion 212. The opening of the C-shaped arrangement of the second upper electrode pad 22 and the opening of the first conductive posts 41 respectively face toward two opposite directions. The second conductive posts 42 are arranged in two rows each parallel to the width direction W, and the two rows of the second conductive posts 42 are connected to a portion of the second upper electrode pad 22 away from the third upper electrode pad 23 and the fourth upper electrode pad 24. In other words, the second conductive posts 42 are arranged adjacent to the opening of the U-shaped arrangement of the first conductive posts 41.

In addition, the light emitter 6 is mounted on the die-bonding portion 211 of the first upper electrode pad 21, and the top surface of the light emitter 6 has two wire-bonding regions spaced apart from each other. One of the two wire-bonding regions of the light emitter 6 is arranged adjacent to the third upper electrode pad 23 and is electrically connected to the two ends of the second upper electrode pad 22 by a wire-bonding manner, and the other one of the two wire-bonding regions of the light emitter 6 is arranged away from the third upper electrode pad 23 and is electrically connected to the second upper electrode pad 22 by a wire-bonding manner.

Furthermore, the third upper electrode pad 23 and the fourth upper electrode pad 24 co-define a notch away from the first upper electrode pad 21. In other words, the third upper electrode pad 23 and the fourth upper electrode pad 24 are jointly formed in a Y-shape. The upper electrode layer 2 further includes a fifth upper electrode pad 25 being in an L-shape, and the fifth upper electrode pad 25 is arranged in the notch defined by the third upper electrode pad 23 and the fourth upper electrode pad 24. The lower electrode layer 3 further includes a plurality of fifth lower electrode pads 35, and the conductive unit 4 includes a plurality of fifth conductive posts 45 connecting the fifth lower electrode pads 35 and the fifth upper electrode pad 25.

In conclusion, the light source device 100, 100a of the present disclosure has a new structural configuration by the arrangement of the components (e.g., the arrangement of the first conductive posts 41, the second conductive posts 42, the upper electrode layer 2, and the lower electrode layer 3), so that the light source device 100, 100a can be applied to transmit a high frequency (or high speed) signal. Specifically, the conductive posts 41-44 can be provided by a specific limitation of the number (e.g., the number of the first conductive posts 41 is at least eight), a position distribution (e.g., the at least two rows of the first conductive posts 41 respectively connect two opposite parts of the periphery portion 212), or a structural design (the area of the top surface 411 is less than that of the bottom surface 412), so that the light source device 100, 100a can be applied to transmit a high frequency (or high speed) signal and can further have a better heat-dissipating performance.

Moreover, by a specific structure of the surrounding frame 5 of the light source device 100, 100a of the present disclosure, the accommodating space S arranged in the surrounding frame 5 can be in spatial communication with an external space through the notch 57, thereby meeting different requirements.

In addition, the surrounding frame 5 of the light source device 100, 100a of the present disclosure can be formed with the slanting surface 55, and the slanting surface 55 is connected to the upper riser 52 and the lower tread 53 so as to form the receiving groove 56 having an angle less than 90 degrees, so that the light source device 100, 100a can accommodate a part of the adhesive 9 by the receiving groove 56.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light source device, comprising:
a substrate including a first surface and a second surface opposite to the first surface;
an upper electrode layer disposed on the first surface of the substrate and including a first upper electrode pad and at least one second upper electrode pad, wherein the first upper electrode pad includes a die-bonding portion and a periphery portion arranged outside of the die-bonding portion;
a lower electrode layer disposed on the second surface of the substrate and including a first lower electrode pad and at least one second lower electrode pad;
a plurality of first conductive posts and a plurality of second conductive posts;
a light emitter mounted on the die-bonding portion of the first upper electrode pad and electrically connected to the at least one second upper electrode pad;
a surrounding frame disposed on the first surface and surroundingly disposed at an outer side of the light emitter; and
a light permeable member disposed on the surrounding frame and covering the light emitter,
wherein the first conductive posts are embedded in the substrate to connect the first upper electrode pad and the first lower electrode pad, and the first conductive posts are arranged along at least two sides of the light emitter at the periphery portion, and
wherein the second conductive posts are embedded in the substrate to connect the at least one second upper electrode pad and the at least one second lower electrode pad.

2. The light source device according to claim 1, wherein the number of the first conductive posts is substantially equal to the number of the second conductive posts.

3. The light source device according to claim 1, wherein the number of the first conductive posts is less than or larger than the number of the second conductive posts by one or two.

4. The light source device according to claim 1, wherein the number of the first conductive posts is at least eight, and the eight first conductive posts are arranged except to the die-bonding portion.

5. The light source device according to claim 1, wherein the first conductive posts arranged along the at least two sides of the light emitter that are arranged at two adjacent sides or are arranged at opposite sides.

6. The light source device according to claim 1, wherein the second conductive posts are arranged in at least one row.

7. The light source device according to claim 1, wherein the first conductive posts are arranged in two rows, each of the two rows includes at least four of the first conductive posts, and the two rows of the first conductive posts are arranged at the periphery portion and are respectively arranged along two sides of the light emitter.

8. The light source device according to claim 1, wherein the number of the first conductive posts is ten, and the ten first conductive posts are respectively arranged along the two opposite sides of the light emitter, and wherein the number of the second conductive posts is ten, and the ten second conductive posts are arranged in one row.

9. The light source device according to claim 1, wherein the number of the first conductive posts is ten, the ten first conductive posts are around the three sides of the light emitter in a U-shaped arrangement, and each edge of the U-shaped arrangement is provided with the same number of the first conductive posts, and wherein the number of the second conductive posts is ten, and the ten second conductive posts are arranged in two rows.

10. The light source device according to claim 1, wherein each of the first conductive posts or each of the second conductive posts is in a truncated cone, and includes a top surface adjacent to the first surface and a bottom surface adjacent to the second surface, and wherein in each of the first conductive posts or each of the second conductive posts, an area of the top surface is less than an area of the bottom surface.

11. The light source device according to claim 10, wherein in each of the first conductive posts or each of the second conductive posts, a ratio defined by dividing a diameter of the top surface by a diameter of the bottom surface is within a range of 2/3 to 4/5.

12. The light source device according to claim 1, wherein the light emitter is a Vertical-Cavity Surface-Emitting Laser (VCSEL) for providing an infrared light.

13. The light source device according to claim 1, wherein the upper electrode layer includes a third upper electrode pad and a fourth upper electrode pad, the lower electrode layer includes a third lower electrode pad and a fourth lower electrode pad, and the light source device further includes a plurality of third conductive posts and a plurality of fourth conductive posts, which are embedded in the substrate, and wherein the third conductive posts are connected to the third upper electrode pad and the third lower electrode pad, and the fourth conductive posts are connected to the fourth upper electrode pad and the fourth lower electrode pad.

14. The light source device according to claim 13, further comprising a light detector, wherein the light detector is mounted on the third upper electrode pad inside of the surrounding frame and is electrically connected to the fourth upper electrode pad, and the light detector is configured to receive an invisible light emitted from the light emitter and reflected by the light permeable member.

15. The light source device according to claim 13, wherein the number of the third conductive posts is at least two, and the number of the fourth conductive posts is at least two.

16. The light source device according to claim 1, wherein the second upper electrode pad is substantially in a C-shape defining an opening, the first conductive posts are in a U-shaped arrangement that defines an opening, and the opening of the C-shaped second upper electrode pad and the opening of the first conductive posts respectively face toward two opposite directions.

17. The light source device according to claim 1, wherein the surrounding frame has an annular step-like structure and is integrally formed as a one-piece structure.

18. The light source device according to claim 1, wherein the light permeable member includes a transparent glass board and a light-diffusion polymer layer formed on the transparent glass board.

19. A depth camera module, comprising a light source device as claimed in claim 1.

20. A light source device, comprising:
- a substrate including a first surface and a second surface opposite to the first surface;
- an upper electrode layer disposed on the first surface of the substrate and including a first upper electrode pad and at least one second upper electrode pad, wherein the first upper electrode pad includes a die-bonding portion and a periphery portion arranged outside of the die-bonding portion;
- a lower electrode layer disposed on the second surface of the substrate and including a first lower electrode pad and at least one second lower electrode pad;
- a plurality of first conductive posts and a plurality of second conductive posts;
- a light emitter mounted on the die-bonding portion of the first upper electrode pad and electrically connected to the at least one second upper electrode pad;
- a surrounding frame disposed on the first surface and surroundingly disposed at an outer side of the light emitter; and
- a light permeable member disposed on the surrounding frame and covering the light emitter,
- wherein the first conductive posts are embedded in the substrate to connect the first upper electrode pad and the first lower electrode pad, and the first conductive posts are arranged along at least three sides of the light emitter at the periphery portion, and
- wherein the second conductive posts are embedded in the substrate to connect the at least one second upper electrode pad and the at least one second lower electrode pad.

* * * * *